US011913842B2

(12) United States Patent
Nagai et al.

(10) Patent No.: US 11,913,842 B2
(45) Date of Patent: Feb. 27, 2024

(54) TEMPERATURE SENSOR AND TEMPERATURE MEASUREMENT APPARATUS

(71) Applicant: Panasonic Intellectual Property Management Co., Ltd., Osaka (JP)

(72) Inventors: Koichi Nagai, Kyoto (JP); Naofumi Hino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 48 days.

(21) Appl. No.: 17/664,421

(22) Filed: May 22, 2022

(65) Prior Publication Data

US 2022/0390293 A1 Dec. 8, 2022

(30) Foreign Application Priority Data

Jun. 2, 2021 (JP) ................................. 2021-093016

(51) Int. Cl.
*G01K 11/26* (2006.01)
*H10N 30/87* (2023.01)
*H10N 30/88* (2023.01)

(52) U.S. Cl.
CPC .......... *G01K 11/265* (2013.01); *H10N 30/87* (2023.02); *H10N 30/88* (2023.02)

(58) Field of Classification Search
None
See application file for complete search history.

(56) References Cited

U.S. PATENT DOCUMENTS

| 2005/0057323 A1* | 3/2005 | Kando | ................. H03H 9/6483 333/141 |
| 2014/0129174 A1* | 5/2014 | White | ................... A61B 5/681 29/601 |
| 2017/0016773 A1 | 1/2017 | Arai et al. | |

FOREIGN PATENT DOCUMENTS

| JP | 1-119214 U | 8/1989 |
| JP | 2008-134117 | 6/2008 |
| JP | 2009-222589 | 10/2009 |
| JP | 2016-011945 | 1/2016 |

* cited by examiner

*Primary Examiner* — Erica S Lin
(74) *Attorney, Agent, or Firm* — Wenderoth, Lind & Ponack, L.L.P.

(57) ABSTRACT

As a temperature measurement apparatus using a surface acoustic wave of a piezoelectric substrate that performs temperature measurement wirelessly and without power supply, the temperature measurement apparatus accurately measures the temperature of the thermocouple tip end by analyzing the frequency characteristics of the surface acoustic wave propagating on the piezoelectric substrate and including temperature information of the piezoelectric substrate, and detecting change in propagation time of the surface acoustic wave of the piezoelectric substrate that is changed by the electromotive force of the thermocouple.

9 Claims, 7 Drawing Sheets

(A) BEFORE POLARIZATION  (B) APPLY STRONG DIRECT-CURRENT ELECTRIC FIELD  (C) AFTER POLARIZATION

WHEN ELECTROMOTIVE FORCE $E_1 > E_2$ OF THERMOCOUPLE (A)

(B)

WHEN ELECTROMOTIVE FORCE $E_2 > E_1$ OF THERMOCOUPLE (A)

(B)

TEMPERATURE SENSOR AND TEMPERATURE MEASUREMENT APPARATUS

BACKGROUND

1. Technical Field

The present disclosure relates to a temperature sensor and a temperature measurement apparatus that measure temperature using a surface acoustic wave by wireless communication.

2. Description of the Related Art

In recent years, in processes of assembling and manufacturing various industrial products or home electric appliances, or in processes of manufacturing various electronic components that become constituent components of these products, various batteries, or devices such as substrates on which electronic components are mounted, furnaces for heat treatment are also diversified, and their functions are greatly improved.

Temperature control of an object to be heated greatly affects performance of a product.

In general, in case of a small furnace or a furnace in which the speed of conveying the object to be heated is very slow, there is a case where it is possible to measure the temperature transition of the object to be heated while a thermocouple is attached in the furnace and connected to a measurer outside the furnace. However, in a case of a large furnace with a long conveyance distance, a furnace with a remarkably high conveyance speed, or a furnace with a structure such as a shutter present in the conveyance path, it is often difficult to measure the temperature in a state where the thermocouple is connected to the measurer outside the furnace. When a thermocouple is used in such a furnace, there is also a method in which a short thermocouple is connected to a wireless unit, introduced into the furnace together with the wireless unit, and information of the thermocouple is wirelessly transmitted to a measurer outside the furnace, or a method in which a data storage device is equipped in the wireless unit, the information of the thermocouple or the like is stored, and the data information is extracted from the storage device after the wireless unit is carried out outside the furnace. However, depending on the temperature in the furnace, the temperature exceeds the heat resistance temperature of a battery serving as a drive power source for a transmitter, a data storage device, or the like at the time of wireless transmission, and the transmitter or the storage device itself, and thus, there are many cases where the thermocouple cannot be used. Therefore, as a wireless measurement sensor not equipped with a battery having a low heat resistance temperature, a transmitter, a storage device, or the like, a sensing technology for measuring temperature using a surface acoustic wave of a piezoelectric substrate is used, and for example, the method of PTL 1 is known.

FIG. 11 is an explanatory diagram of a conventional physical quantity measurement apparatus of PTL 1. PTL 1 describes an example of a SAW sensor in which a comb-shaped electrode is provided on a piezoelectric substrate, and pressure is wirelessly measured as a physical quantity with no power supply. The SAW sensor of PTL 1 includes a piezoelectric substrate 60, a comb-shaped electrode 61, a pressure detection reflector 62, a diaphragm 63, and a temperature compensation reflector 64. The comb-shaped electrode 61 receives a radio signal from the outside, excites surface acoustic wave on the piezoelectric substrate 60, receives the surface acoustic wave propagating on the piezoelectric substrate 60, and converts it into a response signal. The pressure detection reflector 62 reflects the surface acoustic wave excited by the comb-shaped electrode 61. The diaphragm 63 is disposed between the comb-shaped electrode 61 and the pressure detection reflector 62, and deforms according to the pressure difference between a cavity section inside the piezoelectric substrate 60 and the outside to vary the path length of the propagation path of the surface acoustic wave. The temperature compensation reflector 64 is disposed on the side of the comb-shaped electrode 61 on the propagation path of the surface acoustic wave with reference to the diaphragm 63, and reflects the surface acoustic wave excited by the comb-shaped electrode 61. By a computer 66 analyzing information received by a reading device 65 regarding the characteristics of this surface acoustic wave, the pressure at the place where the SAW sensor is placed is measured.

CITATION LIST

Patent Literature

PTL 1: Unexamined Japanese Patent Publication No. 2009-222589

SUMMARY

The present disclosure is configured as follows.

A temperature sensor according to one aspect of the present disclosure includes: a first piezoelectric substrate that propagates a surface acoustic wave; a first comb-shaped electrode on the first piezoelectric substrate, the first comb-shaped electrode being configured to receive an electric signal to excite a first surface acoustic wave on the first piezoelectric substrate, and receive the first surface acoustic wave propagated on the first piezoelectric substrate to generate an electric signal; a first temperature detection reflector on the first piezoelectric substrate at a position opposing the first comb-shaped electrode, the first temperature detection reflector being configured to reflect, toward the first comb-shaped electrode, the first surface acoustic wave excited by the first comb-shaped electrode; a second piezoelectric substrate that propagates a surface acoustic wave; a second comb-shaped electrode on the second piezoelectric substrate, the second comb-shaped electrode being configured to receive an electric signal to excite a second surface acoustic wave on the second piezoelectric substrate, and receive the second surface acoustic wave propagated on the second piezoelectric substrate to generate an electric signal; a second temperature detection reflector on the second piezoelectric substrate at a position opposing the second comb-shaped electrode, the second temperature detection reflector being configured to reflect, toward the second comb-shaped electrode, the second surface acoustic wave excited by the second comb-shaped electrode; and a piezoelectric body that is joined to a back surface of a surface of the second piezoelectric substrate on which the second surface acoustic wave propagates, the piezoelectric body being configured to be deformed by an electromotive force of a thermocouple to change a path length of a propagation path of the second surface acoustic wave on the second piezoelectric substrate with respect to a path length before deformation by the electromotive force.

A temperature sensor according to another aspect of the present disclosure includes: a piezoelectric substrate that propagates a surface acoustic wave; a comb-shaped electrode on the piezoelectric substrate, the comb-shaped electrode being configured to receive a wireless signal to excite first and second surface acoustic waves on the piezoelectric substrate, and receive the first and second surface acoustic waves propagating on the piezoelectric substrate to generate an electric signal; a first temperature detection reflector on the piezoelectric substrate at a position opposing the comb-shaped electrode, the first temperature detection reflector being configured to reflect, toward the comb-shaped electrode, the first surface acoustic wave excited by the comb-shaped electrode; a second temperature detection reflector on the piezoelectric substrate at a position opposing the comb-shaped electrode and a position on a side opposite to the first temperature detection reflector with reference to the comb-shaped electrode, the second temperature detection reflector being configured to reflect, toward the comb-shaped electrode, the second surface acoustic wave excited by the comb-shaped electrode; and a piezoelectric body that is joined to a back surface of a surface of the piezoelectric substrate on which the first and second surface acoustic waves propagate, the piezoelectric body being located between the comb-shaped electrode and the second temperature detection reflector, the piezoelectric body being configured to be deformed by an electromotive force of a thermocouple to change a path length of a propagation path of the second surface acoustic wave on the piezoelectric substrate with respect to a path length before deformation by the electromotive force.

DETAILED DESCRIPTIONS

In the configuration of PTL 1, in a case where the pressure around the piezoelectric substrate 60 changes to only one of a side higher or a side lower than the pressure of a cavity inside the piezoelectric substrate, it is possible to detect change in the propagation distance of a surface acoustic wave by the deformation amount of the diaphragm 63 to calculate change in an external pressure, but in a case where a case where the pressure around the piezoelectric substrate 60 becomes higher than the pressure of the cavity inside the substrate and a case where the pressure around the piezoelectric substrate becomes lower than the pressure of the cavity inside the substrate coexist, it is difficult to distinguish the deformation direction when the diaphragm 63 is deformed in the direction of becoming concave and the direction of becoming convex. Therefore, there is a problem that it is difficult to distinguish the level of the pressure only by the change in the distance in which the surface acoustic wave propagates due to deformation of the diaphragm 63.

An object of the present disclosure is to provide a temperature sensor and a temperature measurement apparatus capable of accurately grasping a change in a status in which a surface acoustic wave generated by a change in a physical quantity of an external environment propagates in a piezoelectric substrate of a SAW device that detects the physical quantity, and accurately measuring the temperature, which is one of the physical quantities.

An exemplary embodiment of the present disclosure will be described below with reference to the drawings.

Exemplary Embodiment

Figure 1:
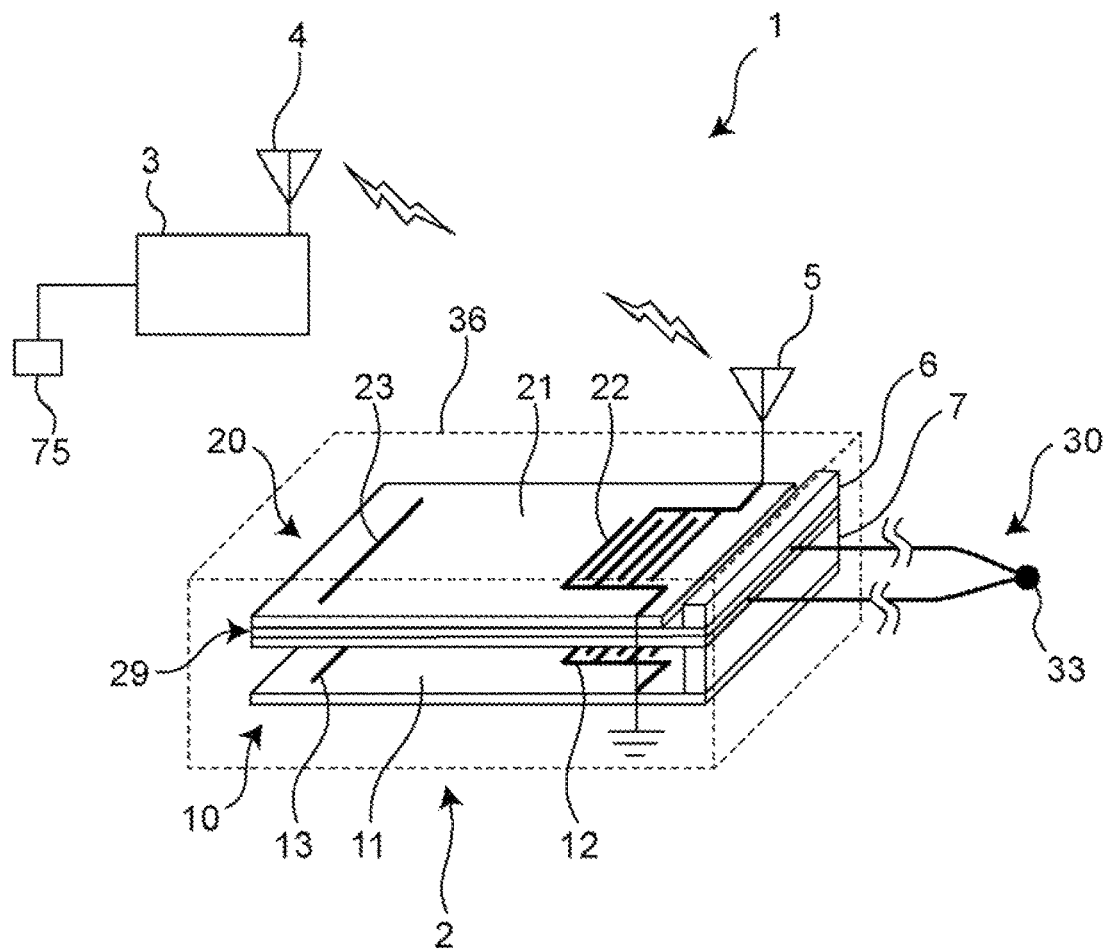
FIG. 1 is an explanatory diagram of a temperature measurement apparatus in an exemplary embodiment of the present disclosure.

FIG. 1 is an explanatory diagram of a temperature measurement apparatus in an exemplary embodiment of the present disclosure.

Temperature measurement apparatus 1 includes temperature sensor 2 and measurer 3.

Temperature sensor 2 includes first SAW device 10, second SAW device 20, and composite piezoelectric body 29.

Measurer 3 is connected to measurer antenna 4 that wirelessly transmits and receives high-frequency electric signals.

Furthermore, temperature measurement apparatus 1 includes temperature calculator 75 connected to measurer 3. Temperature calculator 75 may be disposed in measurer 3 or may be disposed outside measurer 3. Temperature calculator 75 calculates the temperature of tip end 33 of thermocouple 30 based on time change of an electric signal converted from a surface acoustic wave reflected by first temperature detection reflector 13 and second temperature detection reflector 23 described later. In other words, temperature calculator 75 accurately measures the temperature of tip end 33 of thermocouple 30 by analyzing the frequency characteristics of a surface acoustic wave propagating on piezoelectric substrates 21 and 11 and including temperature information of piezoelectric substrates 21 and 11, and detecting a change in propagation time of the surface acoustic wave of piezoelectric substrate 21 changed by an electromotive force of thermocouple 30. Measurer 3 and temperature calculator 75 may be implemented by a computer including one or a plurality of processors and a memory connected to the one or the plurality of processors. When the one or the plurality of processors execute a program stored in the memory, the computer may function as measurer 3 and temperature calculator 75.

Temperature sensor 2 includes temperature sensor antenna 5 for receiving an electric signal transmitted from measurer antenna 4.

Thermocouple 30 is connected to second SAW device 20, and thermocouple 30 extends to the outside beyond identical temperature range 36. Here, identical temperature range 36 means a region in a space surrounding first SAW device 10 and second SAW device 20 and having the identical temperature. One end of second SAW device 20 (that is, one end of composite piezoelectric body 29 described later) is held and cantilevered by first support 6 having a rectangular parallelepiped shape and second support 7 having a rectangular parallelepiped shape, for example.

Figure 2:
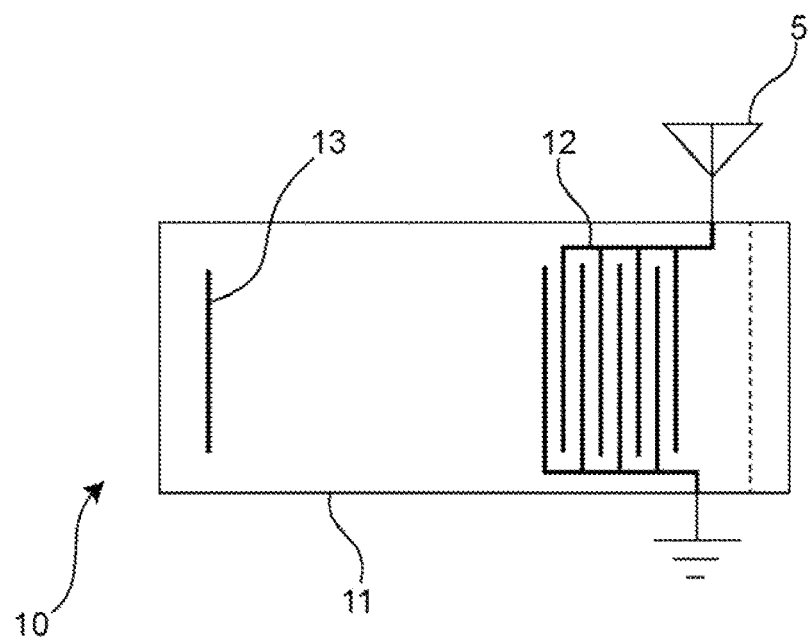
FIG. 2 is an explanatory diagram of a first SAW device in the exemplary embodiment of the present disclosure.

FIG. 2 is a detailed explanatory diagram of first SAW device 10 in the exemplary embodiment of the present disclosure. First SAW device 10 includes first piezoelectric substrate 11, temperature sensor antenna 5, first comb-shaped electrode 12, and first temperature detection reflector 13.

First piezoelectric substrate 11 is provided with temperature sensor antenna 5 for transmitting and receiving electric signals to and from measurer 3.

Temperature sensor antenna 5 is electrically connected to first comb-shaped electrode 12 provided on first piezoelectric substrate 11. First comb-shaped electrode 12 is disposed on first piezoelectric substrate 11 on one end side in the long direction of first piezoelectric substrate 11 having a rectangular plate shape.

First temperature detection reflector 13 is disposed on first piezoelectric substrate 11 on the other end side in the long direction of first piezoelectric substrate 11 at a position opposing first comb-shaped electrode 12.

Measurer 3 wirelessly transmits, from measurer antenna 4, an electric signal by sweeping a high-frequency wave including a predetermined frequency, for example, a frequency in a range of 420 MHz to 430 MHz, which is a specified low power in Radio Law, or 915 MHz to 930 MHz of RFID.

According to the configuration of first SAW device 10, temperature sensor antenna 5 receives a high-frequency electric signal transmitted from measurer antenna 4 connected to measurer 3, and first comb-shaped electrode 12 excites the high-frequency electric signal as a surface acoustic wave on first piezoelectric substrate 11. After excitation, the excited surface acoustic wave propagates on first piezoelectric substrate 11, reaches first temperature detection reflector 13, is reflected from first temperature detection reflector 13 toward first comb-shaped electrode 12, reaches first comb-shaped electrode 12, is converted into an electric signal again, and is transmitted from temperature sensor antenna 5. Measurer antenna 4 connected to measurer 3 receives this electric signal transmitted from temperature sensor antenna 5. By temperature calculator 75 of measurer 3 analyzing this electric signal received by measurer antenna 4, it is possible to calculate the temperature of first piezoelectric substrate 11.

Figure 3:
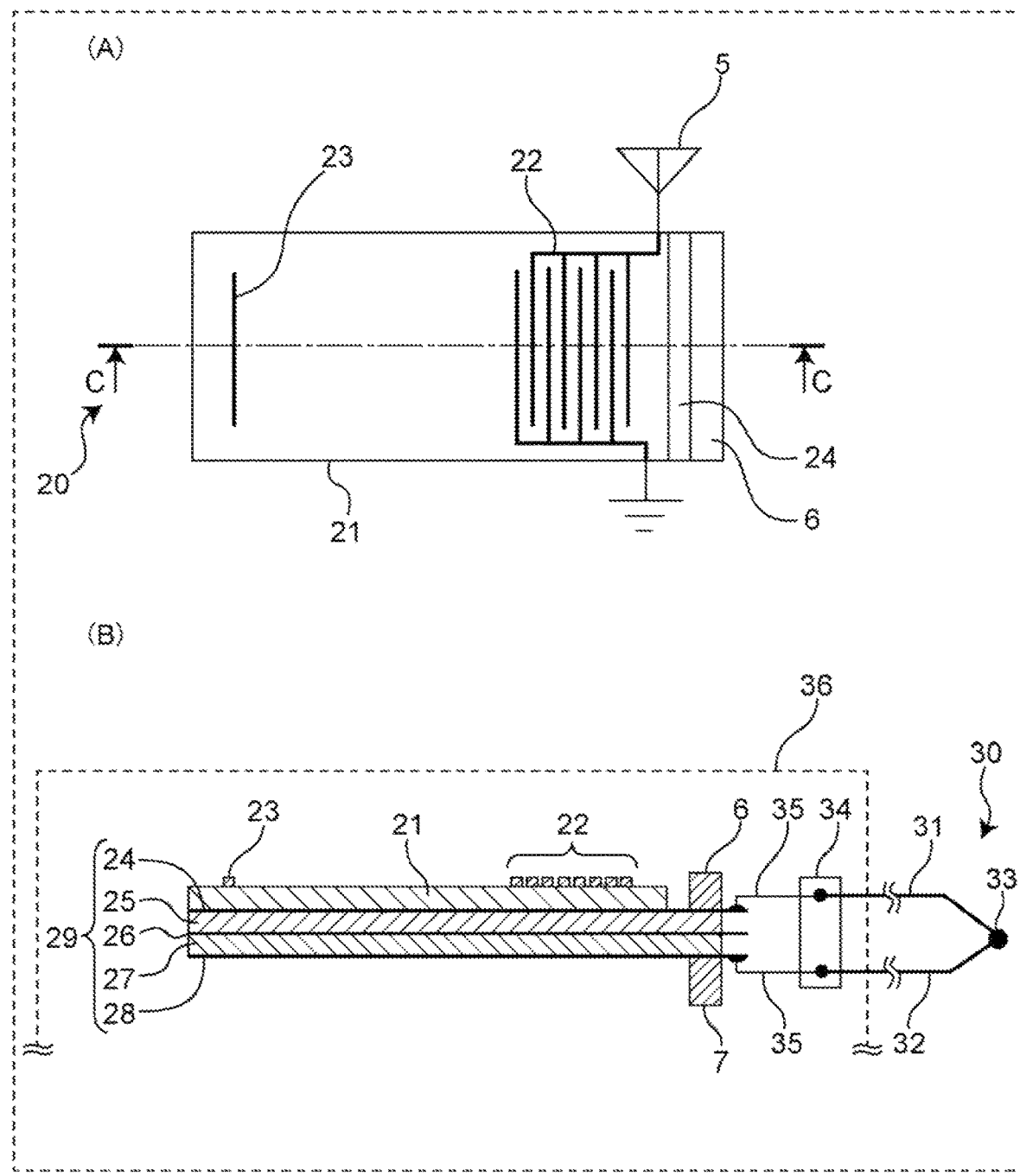
FIG. 3 is an explanatory diagram of a second SAW device in the exemplary embodiment of the present disclosure.

FIG. 3 is a detailed explanatory diagram of second SAW device 20 in the exemplary embodiment of the present disclosure. Part (A) of FIG. 3 is a plan view of second SAW device 20, and part (B) of FIG. 3 is a cross-sectional view taken along line C-C in the plan view of second SAW device 20 in part (A) of FIG. 3.

Second SAW device 20 includes second piezoelectric substrate 21, temperature sensor antenna 5, second comb-shaped electrode 22, and second temperature detection reflector 23.

Second piezoelectric substrate 21 is provided with temperature sensor antenna 5 described above for transmitting and receiving electric signals to and from measurer 3. Temperature sensor antenna 5 is shared by first SAW device 10 and second SAW device 20.

Temperature sensor antenna 5 is electrically connected to second comb-shaped electrode 22 provided on second piezoelectric substrate 21. Second comb-shaped electrode 22 is disposed on second piezoelectric substrate 21 on one end side in the long direction of second piezoelectric substrate 21 having a rectangular plate shape.

Second temperature detection reflector 23 is disposed on second piezoelectric substrate 21 on the other end side in the long direction of second piezoelectric substrate 21 at a position opposing second comb-shaped electrode 22.

According to the configuration of second SAW device 20, similarly to first SAW device 10 described above, temperature sensor antenna 5 receives a high-frequency electric signal transmitted from measurer antenna 4 connected to measurer 3, and second comb-shaped electrode 22 excites the high-frequency electric signal as a surface acoustic wave on second piezoelectric substrate 21. After excitation, the excited surface acoustic wave propagates on second piezoelectric substrate 21, reaches second temperature detection reflector 23, is reflected from second temperature detection reflector 23 toward second comb-shaped electrode 22, reaches second comb-shaped electrode 22, is converted into an electric signal again, and is transmitted from temperature sensor antenna 5. Measurer antenna 4 connected to measurer 3 receives this electric signal transmitted from temperature sensor antenna 5. By temperature calculator 75 of measurer 3 analyzing this electric signal received by measurer antenna 4, it is possible for temperature calculator 75 to calculate the temperature difference between tip end 33 of thermocouple 30 and identical temperature range 36 by second piezoelectric substrate 21.

Here, for example, the lower surface of second piezoelectric substrate 21 is joined to composite piezoelectric body 29 including first piezoelectric body 25 and second piezoelectric body 27. Composite piezoelectric body 29 is configured by bonding first electrode 24, first piezoelectric body 25, second electrode 26, second piezoelectric body 27, and third electrode 28 each having a plate shape.

Furthermore, thermocouple 30 includes first metal conductor 31 and second metal conductor 32, terminals on one side are welded to become tip end 33, and the other terminals of first metal conductor 31 and second metal conductor 32 are connected to insulating terminal block 34. Each of these terminals connected to insulating terminal block 34 is electrically connected to first electrode 24 and third electrode 28 of composite piezoelectric body 29 by wiring 35.

Composite piezoelectric body 29 is in a cantilevered state while being held between first support 6 and second support 7.

According to the configuration of second SAW device 20 described above, an electromotive force is generated between first metal conductor 31 and second metal conductor 32 due to the temperature difference between tip end 33 of thermocouple 30 and insulating terminal block 34, and the electromotive force deforms composite piezoelectric body 29. A deformation method of composite piezoelectric body 29 will be described later. By deformation of composite piezoelectric body 29, second piezoelectric substrate 21 joined to composite piezoelectric body 29 also deforms, which affects the length of the propagation path of the surface acoustic wave on second piezoelectric substrate 21, and can change the length to be long or short. Change in the length of the propagation path of this surface acoustic wave can be detected as a delay time of propagation of the surface acoustic wave, and by analyzing this delay time by temperature calculator 75 of measurer 3, it is possible for temperature calculator 75 to calculate the temperature difference between tip end 33 of thermocouple 30 and identical temperature range 36 including insulating terminal block 34 in association with the electromotive force of thermocouple 30.

According to the configuration of temperature sensor 2 described above, in a case where first piezoelectric substrate 11 of first SAW device 10, second piezoelectric substrate 21 of second SAW device 20, and composite piezoelectric body 29 are in identical temperature range 36, temperature calculator 75 can calculate the temperature in identical temperature range 36 by first piezoelectric substrate 11, and at the same time, temperature calculator 75 can calculate the temperature difference between tip end 33 of thermocouple 30 and identical temperature range 36 by second piezoelectric substrate 21. From these temperatures and temperature differences, the temperature of tip end 33 of thermocouple 30 can be calculated by temperature calculator 75.

Here, deformation of composite piezoelectric body 29 due to potential will be described with reference to FIGS. 4 and 5.

Figure 4:
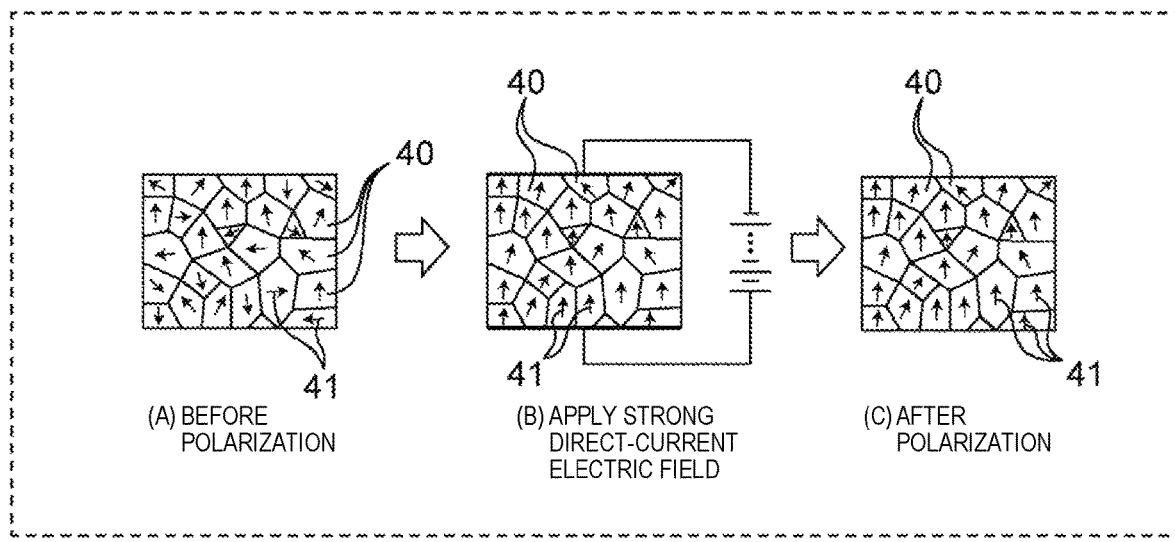
FIG. 4 is an explanatory diagram of polarization of a piezoelectric body.

FIG. 4 is an explanatory diagram of polarization of a general piezoelectric body. FIG. 4 illustrates an enlarged view of ceramics as an example of a piezoelectric body, and the ceramics is an aggregate of ferroelectric microcrystals and generally includes crystal grains 40 of about 1 μm to 5 μm.

Polarization direction 41 in crystal grains 40 of this ceramic is initially directed in every direction, and in order to give piezoelectricity to this ceramic, it is necessary to apply a strong direct-current electric field (several KV/mm) to the ceramic to align polarization direction 41 in the identical direction.

Part (A) of FIG. 4 illustrates a state before polarization, part (B) of FIG. 4 illustrates a state in which a strong direct-current electric field is applied, and part (C) of FIG. 4 illustrates a state in which polarization is finished.

Figure 5:
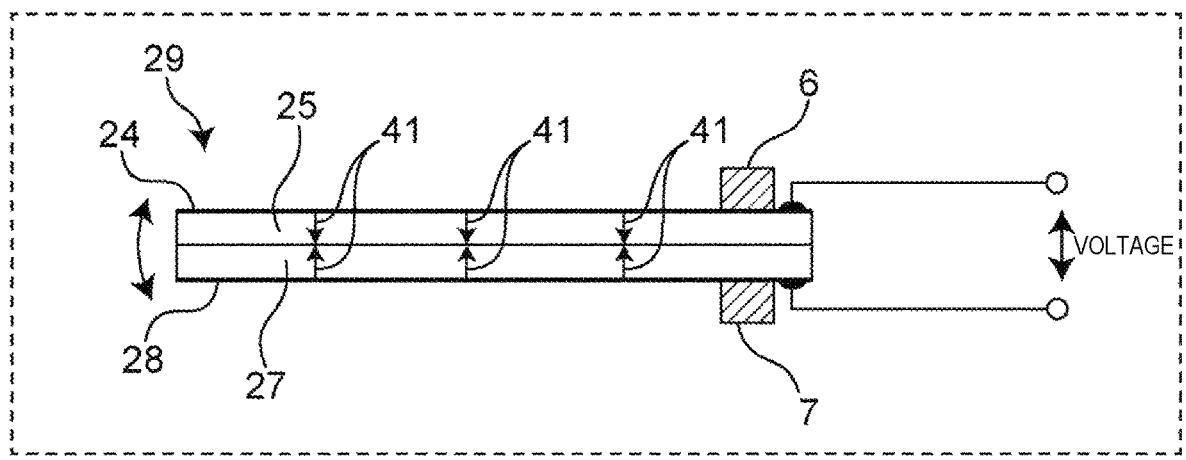
FIG. 5 is an explanatory diagram of a polarization direction of a piezoelectric body and a deformation method by voltage application.

FIG. 5 is an explanatory diagram of the polarization direction of a piezoelectric body and a deformation method by voltage application. First piezoelectric body 25 and second piezoelectric body 27 with polarization directions 41 being aligned are used as a material of composite piezoelectric body 29, and polarization directions 41 of first piezoelectric body 25 and second piezoelectric body 27 are arranged so as to be opposite to each other as in FIG. 5. With such configuration of composite piezoelectric body 29, voltage is applied to first electrode 24 and third electrode 28 so that first electrode 24 has a higher potential than that of third electrode 28. Then, a force acts on the upper surface of composite piezoelectric body 29 in an extending direction, and a force acts on the lower surface of composite piezoelectric body 29 in a contracting direction. The potentials applied to first electrode 24 and third electrode 28 are reversed, and a voltage is applied so that third electrode 28 has a higher potential than that of first electrode 24 while the configuration of composite piezoelectric body 29 remains the same. Then, a force acts on the upper surface of composite piezoelectric body 29 in a contracting direction, and a force acts on the lower surface of composite piezoelectric body 29 in an extending direction.

Figure 6:
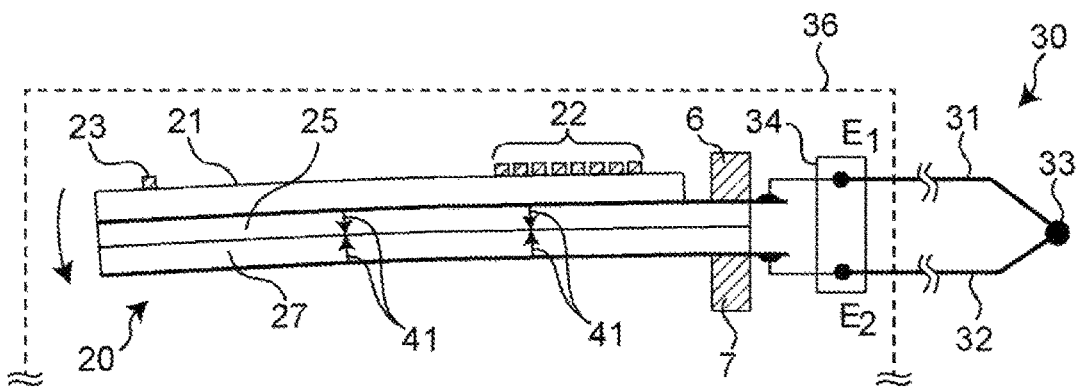
FIG. 6 is an explanatory diagram of an influence of deformation and delay due to a potential of a piezoelectric substrate.
Figure 6:
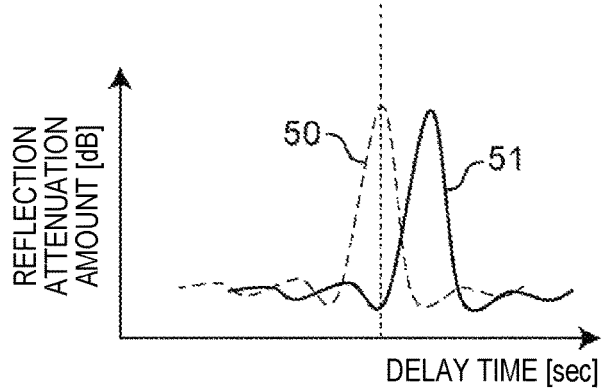
Figure 7:
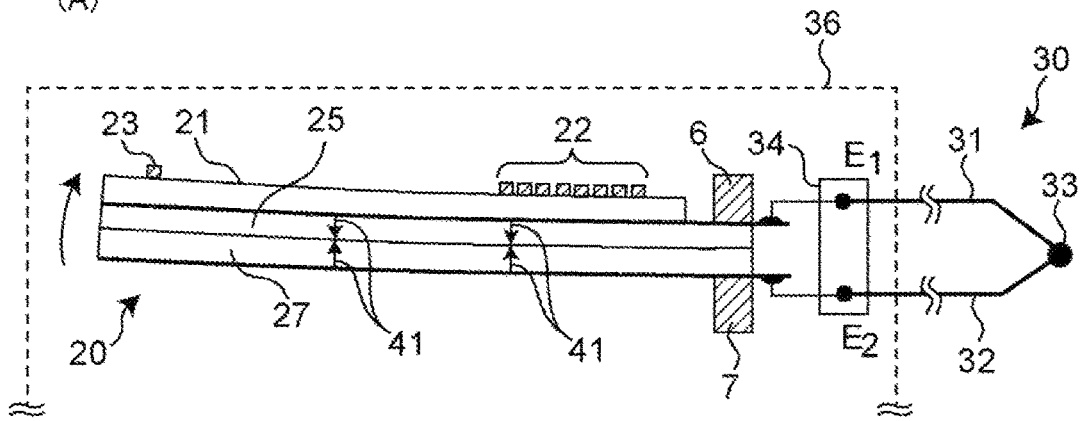
FIG. 7 is an explanatory diagram of an influence of deformation and delay due to the potential of the piezoelectric substrate.
Figure 7:
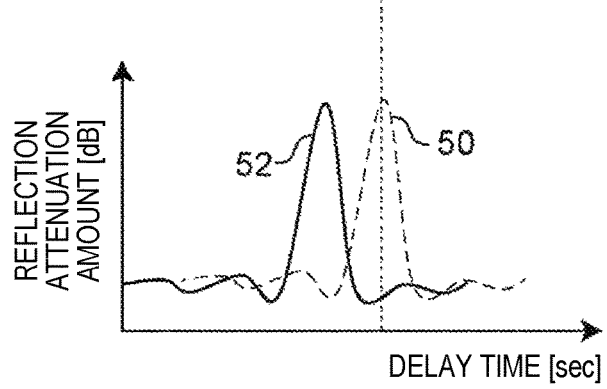

FIGS. 6 and 7 are explanatory diagrams of the influence of deformation and delay due to the potential of the piezoelectric substrate.

Part (A) of FIG. 6 illustrates a case where the potential of first metal conductor 31 is higher than that of second metal conductor 32 due to the electromotive force of thermocouple 30 by the temperature difference (that is, electromotive force E1>E2). In the case where the potential of first metal conductor 31 is higher than that of second metal conductor 32, the upper surface of composite piezoelectric body 29 extends and the lower surface of composite piezoelectric body 29 contracts, so that a downward force acts on composite piezoelectric body 29. At this time, second piezoelectric substrate 21 joined to composite piezoelectric body 29 is extended, and this extends the propagation distance of the surface acoustic wave of second piezoelectric substrate 21, so that the time taken for the surface acoustic wave to propagate on second piezoelectric substrate 21 is delayed. At this time, in part (B) of FIG. 6, in a case where time is delayed with respect to reference return wave 50 in a state in which no potential difference is generated in thermocouple 30, the return wave becomes return wave 51 that has a peak delayed from that of return wave 50.

Part (A) of FIG. 7 illustrates a case where the potential of first metal conductor 31 is higher than that of second metal conductor 32 due to the electromotive force of thermocouple 30 by the temperature difference (that is, electromotive force E2>E1). In the case where the potential of second metal conductor 32 is higher than that of first metal conductor 31, the upper surface of composite piezoelectric body 29 contracts and the lower surface of composite piezoelectric body 29 extends, so that an upward force acts on composite piezoelectric body 29. At this time, second piezoelectric substrate 21 joined to composite piezoelectric body 29 is contracted, and this shortens the propagation distance of the surface acoustic wave of second piezoelectric substrate 21, so that the time taken for the surface acoustic wave to propagate on second piezoelectric substrate 21 is shortened. At this time, in a case where the time is shorted with respect to reference return wave 50 in a state where there is no potential difference in thermocouple 30 as in part (B) of FIG. 7, the return wave becomes return wave 52 that has a peak earlier than that of return wave 50.

By analyzing such change in time by temperature calculator 75 of measurer 3, it is possible for temperature calculator 75 to calculate the temperature difference between the temperature of tip end 33 of thermocouple 30 and the temperature of identical temperature range 36 in association with the electromotive force of thermocouple 30.

Figure 8:
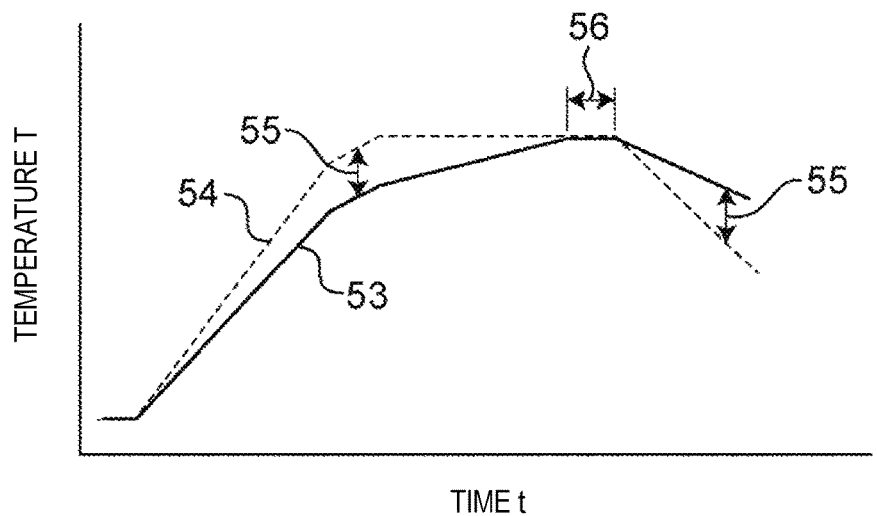
FIG. 8 is an explanatory diagram of a calculation method for temperature of a thermocouple tip end.

FIG. 8 is an explanatory diagram regarding a calculation method for temperature of the thermocouple tip end by temperature calculator 75. An example of transition of the temperature of first piezoelectric substrate 11 of first SAW device 10 in identical temperature range 36 is presented in a graph of temperature 54 in identical temperature range 36 of FIG. 8. Temperature difference 55 between the temperature of second piezoelectric substrate 21 of second SAW device 20 in identical temperature range 36 and the temperature of tip end 33 of thermocouple 30 is calculated by temperature calculator 75 of measurer 3 as a negative value when the temperature of tip end 33 of thermocouple 30 is lower than the temperature of identical temperature range 36, and as a positive value when the temperature of tip end 33 of thermocouple 30 is higher than the temperature of identical temperature range 36. Therefore, the temperature of tip end 33 of thermocouple 30 is presented in a graph in which temperature difference 55 is added as temperature 53 of the thermocouple tip end. This is transition of the temperature of tip end 33 of thermocouple 30.

Region 56 without temperature difference is a region where the thermoelectromotive force of thermocouple 30 becomes 0 when there is no temperature difference between the temperature in identical temperature range 36 and the temperature of tip end 33 of thermocouple 30.

As described above, according to the present exemplary embodiment, as the temperature measurement apparatus using the surface acoustic wave of piezoelectric substrates 11 and 21 that perform temperature measurement wirelessly and without power supply, the temperature measurement apparatus analyzes the frequency characteristics of the surface acoustic wave propagating on piezoelectric substrate 11 and including temperature information of piezoelectric substrate 11, and detects change in propagation time of the surface acoustic wave of piezoelectric substrate 21 that is changed by the electromotive force of thermocouple 30. This makes it possible to detect the temperature of piezoelectric substrate 11 and, using the electromotive force of thermocouple 30 connected to piezoelectric substrate 21, the temperature difference between the temperature of piezoelectric substrate 21 and the temperature of the measurement place where tip end 33 of thermocouple 30 is installed. Therefore, the temperature of tip end 33 of thermocouple 30 installed at a discretionary position can be sensed using the surface acoustic wave of piezoelectric substrate 21 wirelessly and without power supply.

It becomes possible to accurately grasp a change in a status in which a surface acoustic wave generated by a change in a physical quantity of an external environment propagates in piezoelectric substrate 21 of second SAW device 20 that detects the physical quantity, and accurately measure the temperature, which is one of the physical quantities.

(Modification)

Figure 9:
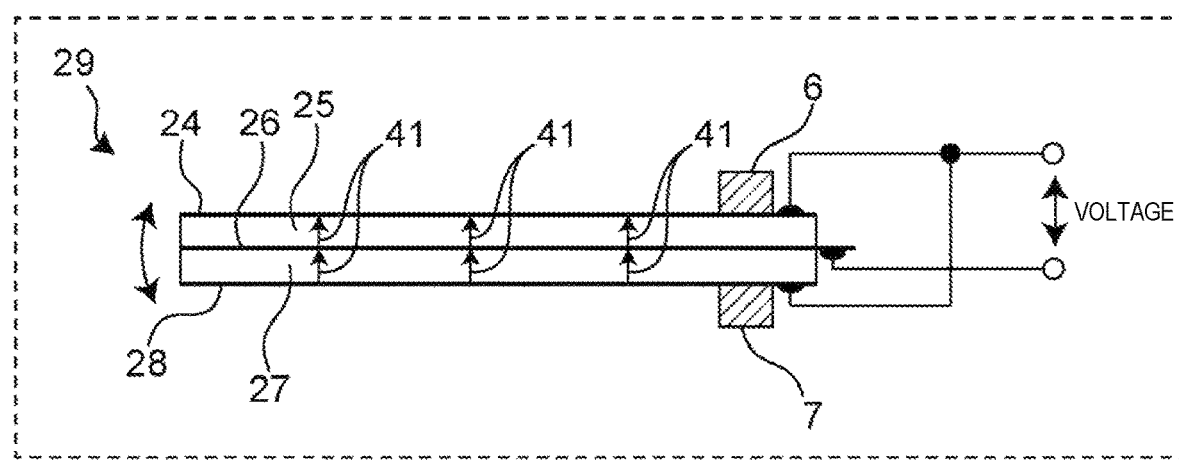
FIG. 9 is an explanatory diagram of a modification of a polarization direction of a piezoelectric body and a deformation method by voltage application.

FIG. 9 is an explanatory diagram of a modification of the polarization direction of a piezoelectric body and a deformation method by voltage application. By using a method in which polarization directions 41 of first piezoelectric body 25 and second piezoelectric body 27 constituting composite piezoelectric body 29 are set to be the same direction as in FIG. 9, first electrode 24 and third electrode 28 are set to be at the same potential, and a voltage is applied among second electrode 26, first electrode 24, and third electrode 28, as compared with the case of the configuration of FIG. 5, when the same voltage is applied, the extension and contraction of composite piezoelectric body 29 by the voltage application becomes about twice, and thus the change in propagation distance of the surface acoustic wave also becomes about twice, which is suitable as a method for increasing the delay time of propagation of the surface acoustic wave.

(Modification)

Figure 10:
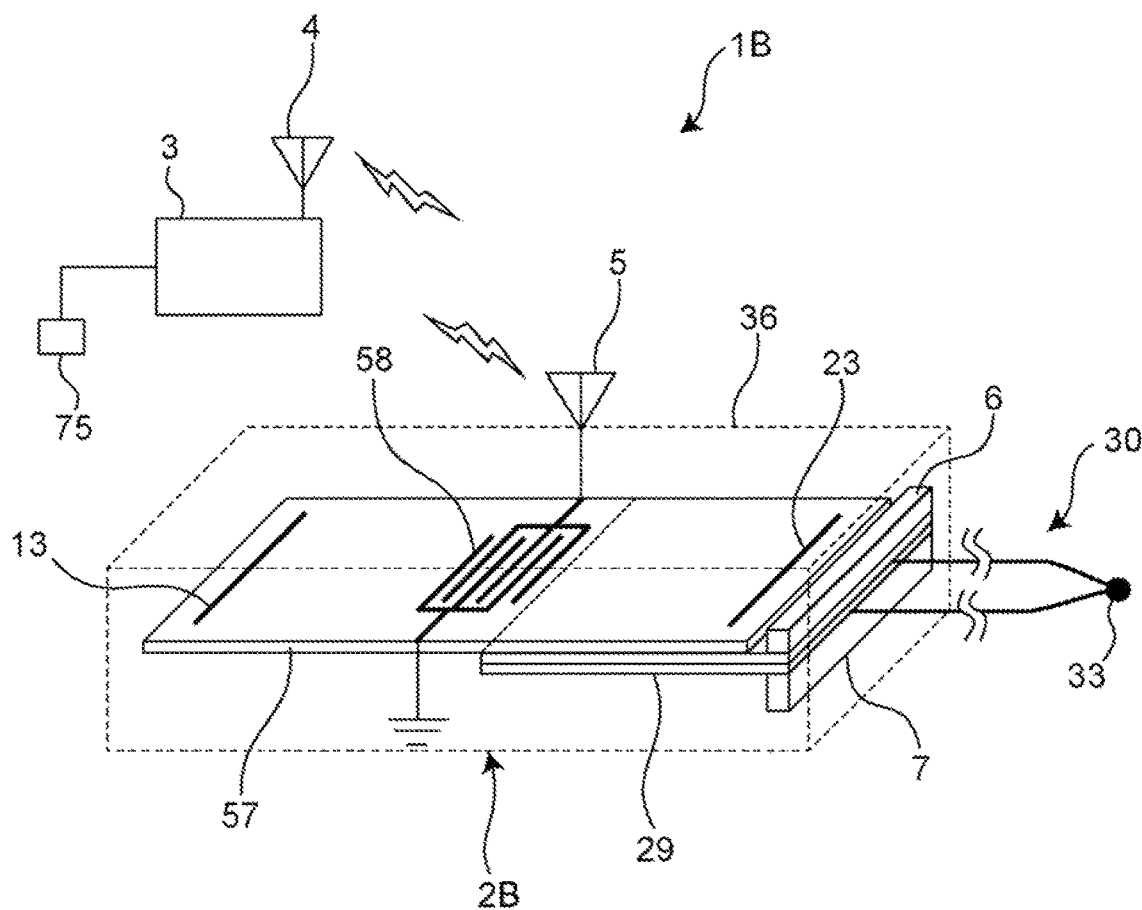
FIG. 10 is an explanatory diagram of a temperature measurement apparatus in a modification of the exemplary embodiment of the present disclosure.
Figure 11:
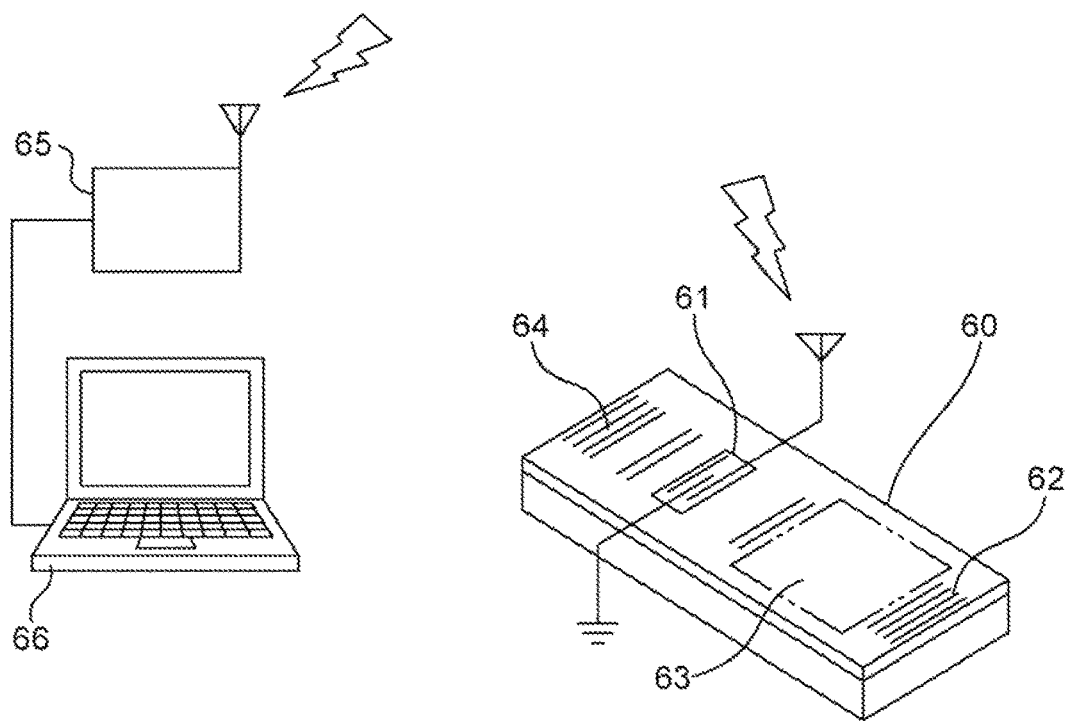
FIG. 11 is an explanatory diagram illustrating a conventional physical quantity measurement apparatus.

FIG. 10 is an explanatory diagram of a temperature measurement apparatus in a modification of the exemplary embodiment of the present disclosure.

Temperature measurement apparatus 1B includes temperature sensor 2B and measurer 3.

Piezoelectric substrate 57 of temperature sensor 2B is provided with temperature sensor antenna 5 for transmitting and receiving electric signals via measurer 3 and measurer antenna 4. Temperature sensor antenna 5 is electrically connected to comb-shaped electrode 58 provided on piezoelectric substrate 57.

First temperature detection reflector 13 and second temperature detection reflector 23 are disposed on piezoelectric substrate 57 across comb-shaped electrode 58 on one end side and the other end side in the long direction of piezoelectric substrate 57 having a rectangular plate shape at positions opposing comb-shaped electrode 58.

Composite piezoelectric body 29 is joined to the back surface of piezoelectric substrate 57 in a range between comb-shaped electrode 58 and second temperature detection reflector 23 where the surface acoustic wave propagates. In composite piezoelectric body 29, one end of thermocouple 30 is wired within identical temperature range 36, and tip end 33 of thermocouple 30 is disposed to extend to the outside of identical temperature range 36.

One end of composite piezoelectric body 29 is held and cantilevered by first support 6 and second support 7, and one end on the opposite side is a free end.

In such configuration, temperature sensor antenna 5 receives a high-frequency electric signal transmitted from measurer antenna 4 connected to measurer 3, and comb-shaped electrode 58 excites the high-frequency electric signal as a surface acoustic wave on piezoelectric substrate 57. The excited surface acoustic wave propagates on piezoelectric substrate 57, reaches first temperature detection reflector 13 and second temperature detection reflector 23, and is reflected from respective reflectors 13 and 23 toward comb-shaped electrode 58. The reflected surface acoustic wave reaches comb-shaped electrode 58, is converted into an electric signal again, and is transmitted from temperature sensor antenna 5. This electric signal is received by measurer antenna 4 connected to measurer 3. At this time, the temperature of piezoelectric substrate 57 in identical temperature range 36 is calculated by analyzing the reflected wave of the surface acoustic wave by first temperature detection reflector 13 by temperature calculator 75.

On the other hand, when there is a temperature difference between the temperature in identical temperature range 36 and the temperature of tip end 33 of thermocouple 30, the reflected wave of the surface acoustic wave by second temperature detection reflector 23 is affected by a change in the propagation distance of the surface acoustic wave because composite piezoelectric body 29 joined to the back surface of piezoelectric substrate 57 is deformed by the electromotive force of thermocouple 30. By analyzing the delay time of this surface acoustic wave by temperature calculator 75 of measurer 3, temperature calculator 75 calculates the temperature difference between the temperature of identical temperature range 36 and the temperature of tip end 33 of thermocouple 30.

The temperature of tip end 33 of thermocouple 30 can be calculated with temperature calculator 75 by the temperature in identical temperature range 36 by the analysis of the reflected wave of first temperature detection reflector 13 and the temperature difference between the temperature in identical temperature range 36 by the analysis of the reflected wave from second temperature detection reflector 23 and the temperature of tip end 33 of thermocouple 30.

When the electric signal received by measurer 3 is analyzed by temperature calculator 75, in a case where it is necessary to distinguish the reflected waves of the surface acoustic waves by first temperature detection reflector 13 and second temperature detection reflector 23, it is possible to easily distinguish the both by differentiating between the attenuation rates of the surface acoustic waves of first temperature detection reflector 13 and second temperature detection reflector 23. For example, by setting the reflectance of the surface acoustic wave by first temperature detection reflector 13 to be larger than the reflectance of the surface acoustic wave by second temperature detection reflector 23, the peak of the attenuation of the reflected wave by the first temperature detection reflector takes a value larger than the attenuation peak of the reflected wave by the second temperature detection reflector, and therefore it is possible to easily distinguish between them.

By appropriately combining discretionary exemplary embodiments or modifications in the various exemplary embodiments or modifications described above, it is possible to achieve the effect possessed by each of them. Combination of exemplary embodiments, combination of examples, or combination of exemplary embodiments and examples are possible, and features in different exemplary embodiments or examples are also possible.

As described above, the temperature sensor and the temperature measurement apparatus according to one aspect of the present disclosure analyze the frequency characteristics of the surface acoustic wave propagating on the piezoelectric substrate and including temperature information of the piezoelectric substrate, and detects change in propagation time of the surface acoustic wave of the piezoelectric substrate that is changed by the electromotive force of the thermocouple. This makes it possible to detect the temperature of the piezoelectric substrate and, using the electromotive force of the thermocouple connected to the piezoelectric substrate, the temperature difference between the temperature of the piezoelectric substrate and the temperature of the measurement place where the tip end of the thermocouple is installed. Therefore, the temperature of the tip end of the thermocouple installed at a discretionary position can be sensed using the surface acoustic wave of the piezoelectric substrate wirelessly and without power supply.

It becomes possible to accurately grasp a change in a status in which a surface acoustic wave generated by a change in a physical quantity of an external environment propagates in the piezoelectric substrate of the SAW device that detects the physical quantity, and accurately measure the temperature, which is one of the physical quantities.

The temperature sensor and the temperature measurement apparatus according to the above aspect of the present disclosure can detect not only the temperature of the SAW device having an antenna for wireless communication but also the temperature of the tip end of a thermocouple extending from the SAW device, and can measure the temperature by installing the thermocouple at a necessary position regardless of the constraint condition for wireless communication. Therefore, as a system for measuring a temperature with high accuracy wirelessly or without power supply, the above aspect of the present disclosure can be applied to a heat treatment method and apparatus for performing various heat treatment such as a drying furnace, a curing furnace, or a reflow furnace in a manufacturing process of an industrial product or a home appliance or a manufacturing process of various electronic components accompanied by conveyance.

What is claimed is:

1. A temperature sensor comprising:
    a first piezoelectric substrate that propagates a first surface acoustic wave;
    a first comb-shaped electrode on the first piezoelectric substrate;
    a first temperature detection reflector on a same surface of the first piezoelectric substrate as the first comb-shaped electrode and at a position opposing the first comb-shaped electrode;
    a second piezoelectric substrate that propagates a second surface acoustic wave;
    a second comb-shaped electrode on the second piezoelectric substrate;
    a second temperature detection reflector on a same surface of the second piezoelectric substrate as the second comb-shaped electrode and at a position opposing the second comb-shaped electrode; and
    a piezoelectric body that is joined to a back surface of the second piezoelectric substrate opposite to a surface of the second piezoelectric substrate on which the second surface acoustic wave propagates, the piezoelectric body being configured to be deformed by an electromotive force of a thermocouple to change a path length of a propagation path of the second surface acoustic wave on the second piezoelectric substrate with respect to a path length before deformation by the electromotive force.

2. A temperature sensor comprising:
    a piezoelectric substrate that propagates a surface acoustic wave;
    a comb-shaped electrode on the piezoelectric substrate;
    a first temperature detection reflector on a same surface of the piezoelectric substrate as the comb-shaped electrode and at a position opposing the comb-shaped electrode;
    a second temperature detection reflector on the same surface of the piezoelectric substrate as the comb-shaped electrode and at a position opposing the comb-shaped electrode and on a side opposite to the first temperature detection reflector with reference to the comb-shaped electrode; and
    a piezoelectric body that is joined to a back surface of the piezoelectric substrate opposite to a surface of the piezoelectric substrate on which the surface acoustic wave propagates, the piezoelectric body being located between the comb-shaped electrode and the second temperature detection reflector, and the piezoelectric body being configured to be deformed by an electromotive force of a thermocouple to change a path length of a propagation path of the surface acoustic wave on the piezoelectric substrate with respect to a path length before deformation by the electromotive force.

3. The temperature sensor according to claim 1, wherein the first temperature detection reflector and the second temperature detection reflector have a difference in attenuation rate for reflecting the first and second surface acoustic waves.

4. A temperature measurement apparatus comprising:
    the temperature sensor according to claim 1; and
    a measurer that wirelessly transmits and receives electric signals,
    wherein the measurer includes a temperature calculator that calculates a temperature of a tip end of the thermocouple based on a time change in the electric signals generated from the first and second surface acoustic waves reflected by the first temperature detection reflector and the second temperature detection reflector.

5. The temperature sensor according to claim 1, wherein the first piezoelectric substrate and the second piezoelectric substrate are located at positions having a same temperature range.

6. The temperature sensor according to claim 1, wherein the first comb-shaped electrode is connected to a same antenna as the second comb-shaped electrode.

7. The temperature sensor according to claim 1, wherein the piezoelectric body is bonded to the back surface of the second piezoelectric substrate opposite to the surface of the second piezoelectric substrate on which the second surface acoustic wave propagates,
    the piezoelectric body is connected to the thermocouple, and
    when the piezoelectric body is deformed by the electromotive force of the thermocouple, the path length of the propagation path of the second surface acoustic wave on the second piezoelectric substrate changes with respect to the path length before deformation by the electromotive force.

8. The temperature sensor according to claim 1, wherein
the piezoelectric body is bonded to the back surface of the second piezoelectric substrate opposite to the surface of the second piezoelectric substrate on which the second surface acoustic wave propagates,
the piezoelectric body is a laminate and includes a first electrode, a first piezoelectric body, a second electrode, a second piezoelectric body, and a third electrode laminated in this order,
the first electrode contacts the back surface of the second piezoelectric substrate,
the thermocouple is connected to the first electrode and the third electrode, and
the piezoelectric body is deformed by the electromotive force of the thermocouple to change the path length of the propagation path of the second surface acoustic wave on the second piezoelectric substrate with respect to the path length before the deformation by the electromotive force.

9. The temperature sensor according to claim 1, wherein
the first piezoelectric substrate and the second piezoelectric substrate are separated from each other.

* * * * *